United States Patent
Yu et al.

(10) Patent No.: US 10,905,028 B2
(45) Date of Patent: Jan. 26, 2021

(54) STRUCTURE FOR ELIMINATING THE IMPACT OF COLD PLATE FOULING

(71) Applicant: International Business Machines Corporation, Armonk, NY (US)

(72) Inventors: Xiangfei Yu, Wappingers Falls, NY (US); Dustin Demetriou, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/405,480

(22) Filed: May 7, 2019

(65) Prior Publication Data
US 2020/0359527 A1    Nov. 12, 2020

(51) Int. Cl.
*H05K 7/20* (2006.01)
*G06F 1/20* (2006.01)

(52) U.S. Cl.
CPC ........... *H05K 7/20254* (2013.01); *G06F 1/20* (2013.01); *H05K 7/20272* (2013.01); *H05K 7/20281* (2013.01); *G06F 2200/201* (2013.01)

(58) Field of Classification Search
USPC ................................. 361/699, 702; 527/714
See application file for complete search history.

(56) References Cited

U.S. PATENT DOCUMENTS

| | | | | |
|---|---|---|---|---|
| 3,361,195 A | * | 1/1968 | Motto, Jr. | ........... H01L 23/4735 165/80.4 |
| 4,566,890 A | * | 1/1986 | Hostler | ................... C03B 37/02 134/198 |
| 4,714,107 A | * | 12/1987 | Adsett | ....................... F28F 3/12 165/166 |
| 4,733,293 A | * | 3/1988 | Gabuzda | ............. H01L 23/3672 165/185 |
| 5,016,090 A | * | 5/1991 | Galyon | ............... H01L 23/4336 257/714 |
| 5,453,641 A | * | 9/1995 | Mundinger | ............... F28D 9/00 165/104.21 |
| 5,473,508 A | * | 12/1995 | Porter | ................... H01L 23/467 165/80.3 |

(Continued)

OTHER PUBLICATIONS

Postoresi et al., "Thermal performances of a multi-scale fluidic network", Applied Thermal Engineering 147 (2019) pp. 1096-1106.

*Primary Examiner* — Binh B Tran
*Assistant Examiner* — Krystal Robinson
(74) *Attorney, Agent, or Firm* — Cantor Colburn LLP; Tihon Poltavets (57) ABSTRACT

A cold plate is provided and includes fins defining first channels, a plenum adjacent to an upstream end of each of the first channels, a lid, ribs and a blocking element. The lid defines an inlet fluidly communicative with the plenum. The ribs extend between the lid and the fins to define second channels oriented transversely relative to the first channels. The second channels include a proximal second channel fluidly communicative with the plenum. The blocking element is configured to normally encourage coolant flowing through the inlet to flow toward the plenum and the upstream end of each of the first channels and to normally discourage the coolant from flowing into the proximal second channel.

17 Claims, 3 Drawing Sheets

(56) References Cited

U.S. PATENT DOCUMENTS

| | | | |
|---|---|---|---|
| 5,504,650 A * | 4/1996 | Katsui | G06F 1/20 361/697 |
| 5,666,269 A * | 9/1997 | Romero | H01L 23/473 165/80.4 |
| 6,230,791 B1 * | 5/2001 | Van Dine | H01L 23/473 165/168 |
| 6,367,543 B1 * | 4/2002 | Calaman | F28F 3/022 165/134.1 |
| 6,386,272 B1 | 5/2002 | Starner et al. | |
| 6,760,221 B2 * | 7/2004 | Goth | F28D 15/0266 174/16.1 |
| 6,986,382 B2 * | 1/2006 | Upadhya | F04B 19/006 165/104.21 |
| 7,104,312 B2 * | 9/2006 | Goodson | F04B 19/006 165/104.33 |
| 7,259,965 B2 * | 8/2007 | Chang | H01L 23/473 165/80.4 |
| 7,331,378 B2 * | 2/2008 | Bhatti | F28F 9/026 165/80.4 |
| 7,331,380 B2 * | 2/2008 | Ghosh | H01L 23/473 165/104.33 |
| 7,562,617 B2 * | 7/2009 | Di Stefano | G01R 1/0433 92/91 |
| 7,916,483 B2 * | 3/2011 | Campbell | H05K 7/20236 361/702 |
| 8,987,891 B2 * | 3/2015 | Di Stefano | H01L 23/34 257/712 |
| 9,357,675 B2 * | 5/2016 | Campbell | B23P 15/26 |
| 9,848,509 B2 * | 12/2017 | Shedd | F25B 41/003 |
| 9,901,008 B2 * | 2/2018 | Shedd | F28D 15/00 |
| 10,103,089 B2 * | 10/2018 | Kaslusky | H01L 23/467 |
| 10,139,168 B2 * | 11/2018 | Chainer | H01L 23/427 |
| 2005/0072177 A1 * | 4/2005 | Hale | F28F 3/12 62/310 |
| 2006/0096738 A1 * | 5/2006 | Kang | H01L 23/473 165/80.4 |
| 2006/0226539 A1 * | 10/2006 | Chang | H01L 23/473 257/712 |
| 2007/0256810 A1 * | 11/2007 | Di Stefano | H01L 23/473 165/46 |
| 2008/0073063 A1 | 3/2008 | Clavenna et al. | |
| 2009/0141451 A1 * | 6/2009 | Mori | H01L 23/3735 361/699 |
| 2009/0200007 A1 * | 8/2009 | Foy | H01L 23/473 165/287 |
| 2009/0316360 A1 * | 12/2009 | Campbell | H01L 23/4735 361/699 |
| 2010/0002392 A1 * | 1/2010 | Liu | H01L 23/427 361/699 |
| 2010/0290190 A1 * | 11/2010 | Chester | H05K 7/20772 361/701 |
| 2012/0111037 A1 | 5/2012 | Campbell et al. | |
| 2013/0021752 A1 * | 1/2013 | Campbell | H05K 7/20745 361/700 |
| 2013/0077246 A1 * | 3/2013 | Campbell | H05K 7/20772 361/700 |
| 2017/0105313 A1 | 4/2017 | Shedd et al. | |
| 2018/0132353 A1 * | 5/2018 | Predon | H05K 3/22 |
| 2019/0204023 A1 * | 7/2019 | Takken | F28F 3/04 |
| 2020/0005592 A1 * | 1/2020 | Wasinger | H05K 5/0017 |

* cited by examiner

STRUCTURE FOR ELIMINATING THE IMPACT OF COLD PLATE FOULING

BACKGROUND

The present invention generally relates to cold plates, and more specifically, to structure for eliminating an impact of fouling on a cold plate.

All electronic devices and circuitry generate heat. This heat is sometimes considered excessive and needs to be removed. The removal of excess heat from an electronic device or circuitry is typically referred to as "thermal management" and is often provided to improve reliability and prevent premature failure of the electronic device or circuitry.

There are several techniques for cooling electronic devices and circuitry. These include, but are not limited to, various styles of heat sinks, thermoelectric coolers, forced air systems and fans, heat pipes and others.

SUMMARY

Embodiments of the present invention are directed to a cold plate. A non-limiting example of the cold plate includes fins defining first channels, a plenum adjacent to an upstream end of each of the first channels, a lid, ribs, and a blocking element. The lid defines an inlet fluidly communicative with the plenum. The ribs extend between the lid and the fins to define second channels oriented transversely relative to the first channels. The second channels include a proximal second channel fluidly communicative with the plenum. The blocking element is configured to normally encourage coolant flowing through the inlet to flow toward the plenum and the upstream end of each of the first channels and to normally discourage the coolant from flowing into the proximal second channel.

Embodiments of the present invention are directed to a cold plate. A non-limiting example of the cold plate includes a base disposable in contact with a component to be cooled, fins extending from the base to define first channels, a plenum adjacent to an upstream end of each of the first channels, a lid, ribs, and a blocking element. The lid defines an inlet fluidly communicative with the plenum. The ribs extend between the lid and the fins to define second channels oriented transversely relative to the first channels. The second channels include a proximal second channel fluidly communicative with the plenum. The blocking element is configured to normally encourage coolant flowing through the inlet to flow toward the plenum and the upstream end of each of the first channels and to normally discourage the coolant from flowing into the proximal second channel.

Embodiments of the present invention are directed to a cold plate assembly. A non-limiting example of the cold plate assembly includes a component and a cold plate. The component includes electrical devices. The cold plate is configured to remove heat generated by the electrical devices. The cold plate includes a base disposable in contact with the component, fins extending from the base to define first channels, a plenum adjacent to an upstream end of each of the first channels, a lid, ribs, and a blocking element. The lid defines an inlet fluidly communicative with the plenum. The ribs extend between the lid and the fins to define second channels oriented transversely relative to the first channels. The second channels include a proximal second channel fluidly communicative with the plenum. The blocking element is configured to normally encourage coolant flowing through the inlet to flow toward the plenum and the upstream end of each of the first channels and to normally discourage the coolant from flowing into the proximal second channel.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, cold plates have been used extensively in electronics industries to cool components with high power. Types of components that can be cooled with cold plates include, but are not limited to, central processing units (CPUs) and other similar devices. In most cases, a given cold plate is disposed adjacent to the component to be cooled and a coolant is moved through channels defined through the cold plate. The coolant can be fluid or gas and serves to remove heat from the component directly or to remove heat from the cold plate which, in turn, removes heat from the component. To this end, the coolant is typically maintained at a temperature which is similar to or lower than the desired temperature of the component.

An issue that can reduce the effectiveness of the cold plate is fouling. Fouling occurs when the coolant, such as a fluid, is heated or otherwise affected in a manner that causes the coolant to change in character and thus become substantially more viscous. In such cases, the fouled coolant can partially or fully clog the channels and, as a result, less coolant can move through the cold plate. This, in turn, impacts the performance of the cold plate by reducing an amount of heat the cold plate can remove from the component, for a given component temperature. Although chemical treatments, such as adding biocide, and mechanical processing, such as filtering, have been explored to make cold plates more resistant to fouling, these solutions often come with additional cost.

Turning now to an overview of the aspects of the invention, one or more embodiments of the invention that address the above-described shortcomings of the prior art provide for a structure for mitigating the impact of fouling in a cross-flow cold plate. The structure has two main features. These include a series of ribs manufactured into the lid of the cold plate to allow fluid to bypass the fluid channel entrance and enter a series of fluid manifolds when the fin entrance is clogged and a structure at the entrance to the fluid channels that forces the fluid down into a plenum and creates a high resistance path to the fluid manifolds when the fins are not clogged. The ribs are located in the lid such that they are placed proximate to the hot spots on the processor module being cooled. The relative location of the ribs forces the fluid to impinge on the base of the cold plate thus enhancing the heat transfer near the hot spots when the fluid channels are clogged. The structure at the entrance to the fluid channels keeps fluid from entering the manifold region when the channels are not clogged and eliminates the thermal penalty of having the fluids bypass the fluid channels during normal operation of the cold plate.

The above-described aspects of the invention address the shortcomings of the prior art by providing a design for a cold plate structure. This design will help to avoid or mitigate fouling and thus will help to alleviate the thermal impact of fouling and thereby reduce the cost of other mitigation efforts.

Figure 1:
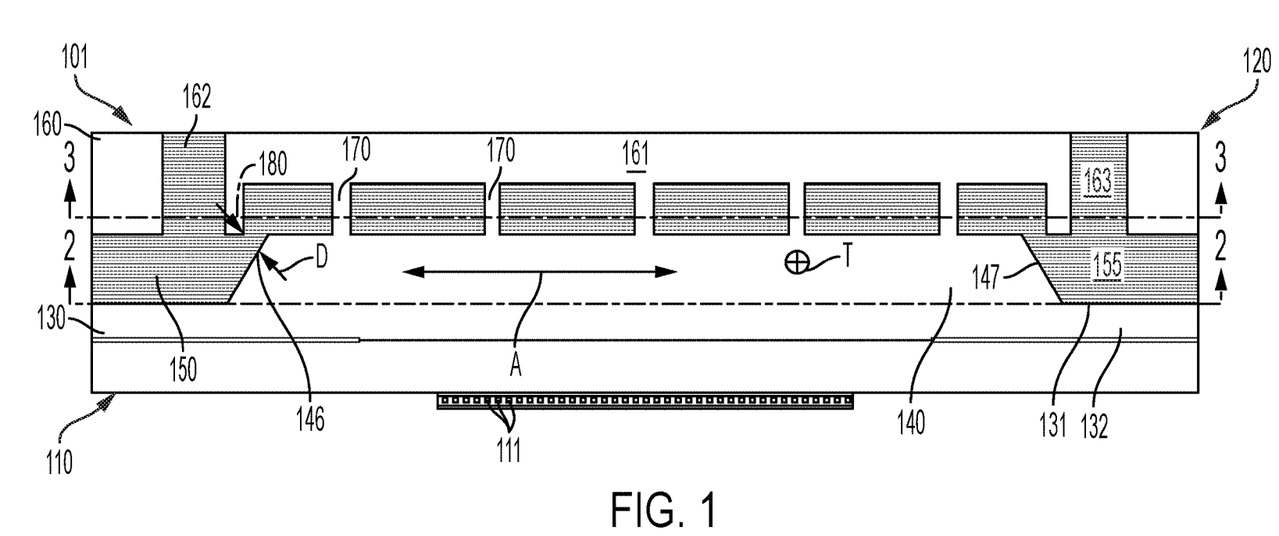
FIG. 1 is a side view of a cold plate assembly in accordance with embodiments of the present invention.
Figure 2:
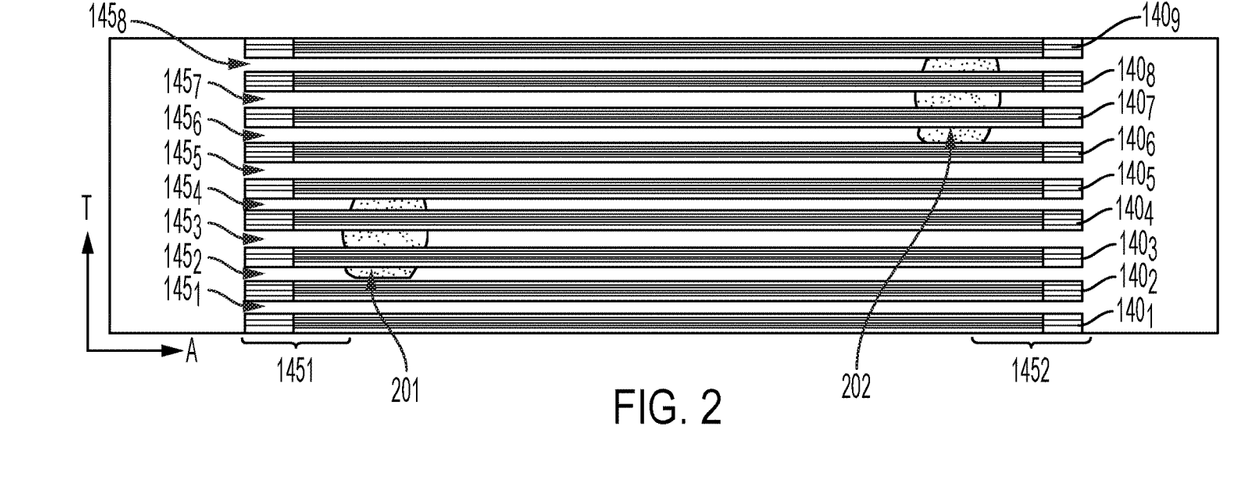
FIG. 2 is a top-down view of components of the cold plate assembly of FIG. 1 taken along line 2-2 of FIG. 1.
Figure 3:
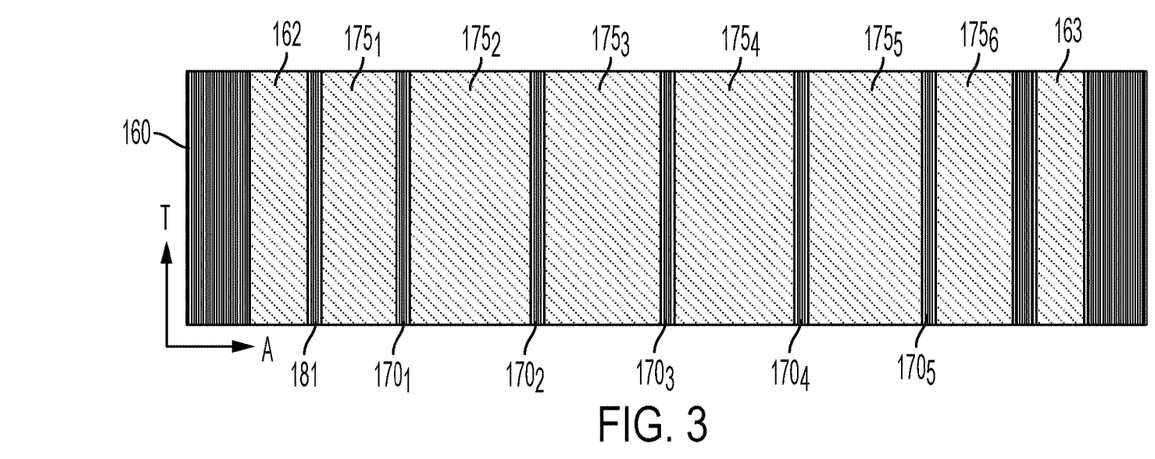
FIG. 3 is a top-down view of components of the cold plate assembly of FIG. 1 taken along line 3-3 of FIG. 1.

Turning now to a more detailed description of aspects of the present invention, FIGS. 1-3, a cold plate assembly 101 is provided and includes a component 110 and a cold plate 120. The component 110 includes electrical devices 111. The cold plate 120 is configured to remove heat generated by the electrical devices 111. The cold plate 120 includes a base 130, fins 140, a first plenum 150 and a second plenum 155, a lid 160, ribs 170 and a blocking element 180.

The base 130 is generally flat and planar and includes a body having an upper surface 131 and a lower surface 132. The base 130 is disposable with the lower surface 132 in contact with the component 110. The fins 140 extend upwardly from the upper surface 131 of the base 130 and are arranged at a distance from one another to define first channels $145_{1-8}$ (see FIG. 2). Each first channel 145 has an upstream end 1451 and a downstream end 1452 (see FIG. 2). In some but not necessarily all embodiments, each fin 140 can have an angled surface 146 or a vertical surface at the upstream end 1451 and a similarly configured downstream surface 147 at the downstream end 1452. The first plenum 150 is disposed adjacent to the upstream end 1451 of each of the first channels 145 and the second plenum 155 is disposed adjacent to the downstream end 1452 of each of the first channels 145. The lid 160 is disposable over and above the base 130 and the fins 140 and includes a body 161 that is formed to define an inlet 162 and an outlet 163. The inlet 162 is fluidly communicative with the first plenum 150 and the outlet 163 is fluidly communicative with the second plenum 155.

During normal operations when none of the first channels 145 are blocked (i.e., by fouled coolant), coolant flows through the inlet 162 and into the first plenum 150. From the first plenum 150, the coolant flows through each of the first channels 145 along an axial dimension A (see FIGS. 2 and 3) of the first channels 145 and into the second plenum 155. From the second plenum 155, the coolant flows into and through the outlet 163.

As shown in FIG. 3, the ribs 170 extend between a lower surface of the lid 160 and upper surfaces of the fins 140 and are spaced from one another to define second channels 175.

The second channels 175 are oriented transversely (e.g., perpendicularly) relative to the first channels 145. The second channels 175 include a proximal second channel $175_1$ that is proximate to and fluidly communicative with the first plenum 150, a distal second channel $175_6$ that is proximate to and fluidly communicative with the second plenum 155 and intermediate second channels $175_{2-5}$ between the proximal second channel $175_1$ and the distal second channel $175_6$. The proximal second channel $175_1$ allows for fluid communication in a transverse direction T (see FIGS. 2 and 3), which is defined transversely (e.g., perpendicularly) relative to the axial dimension A, among the first channels 145 at axial locations of the first channels 145 defined upstream from proximal rib $170_1$. The distal second channel $175_6$ allows for fluid communication in the transverse direction T among the first channels 145 at axial locations of the first channels 145 defined downstream from distal rib $170_5$. The intermediate second channels $175_{2-5}$ respectively allow for fluid communication in the transverse direction T among the first channels 145 at axial locations of the first channels 145 defined between the corresponding pairs of ribs $170_{1-5}$.

In accordance with embodiments of the present invention, one or more of the ribs 170 or the second channels 175 can be localized at a hot spot of the component 110. For example, as shown in FIG. 1, it can be assumed that the electrical devices 111 form the hot spots of the component 110 and that the corresponding ribs 170 or the intermediate second channels $175_{2-5}$ are localized proximate to the hot spots formed by the electrical devices 111.

During the normal operations when none of the first channels 145 are blocked, the blocking element 180 is disposed and configured to normally encourage the coolant flowing through the inlet 162 to flow toward and into the first plenum 150 and then toward and into the upstream end 1451 of each of the first channels 145. Concurrently, during the normal operations when none of the first channels 145 are blocked, the blocking element 180 is disposed and configured to normally discourage the coolant from flowing from the first plenum 150 and into the proximal second channel $175_1$.

During abnormal operations when one or more of the first channels 145 are blocked at some point along the axial dimension upstream from the proximal rib $170_1$, the blocking element 180 is disposed and configured to normally discourage the coolant from flowing through the inlet 162 to flow toward and into the first plenum 150 and then toward and into the upstream end 1451 of each of the first channels 145. Concurrently, during the abnormal operations when the one or more of the first channels 145 are blocked at some point along the axial dimension upstream from the proximal rib $170_1$, the blocking element 180 is disposed and configured to permit the coolant to flow from the first plenum 150 and into the proximal second channel $175_1$.

In accordance with embodiments of the present invention, the blocking element 180 can include a rib 181 (see FIG. 3) that extends from the lower surface of the lid 160 and terminates at a distance D from the fins 140 at the upstream end 1451 of each of the first channels 145. With this configuration, the rib 181 forms a torturous path for the coolant to enter the proximal second channel $175_1$. During the normal operations when none of the first channels 145 are blocked, this torturous path normally discourages the coolant from flowing from the first plenum 150 and into the proximal second channel $175_1$. During the abnormal operations when one or more of the first channels 145 are blocked at some point along the axial dimension upstream from the proximal rib $170_1$, the torturous path permits the coolant to flow from the first plenum 150 and into the proximal second channel $175_1$.

With the configurations described above, operations of the cold plate 120 will now be described with continued reference to FIGS. 1-3 and with particular reference to FIG. 2.

In the case of the fouling event 201 that affects first channels $145_{2-4}$ at an axial location corresponding to the proximal rib $170_1$, coolant that would otherwise enter and flow through the first channels $145_{2-4}$, either flows into the proximal second channel $175_1$ as permitted by the blocking element 180 or flows into the first channels $145_{2-4}$, impinges upon the fouling event 201 and flows upwardly into the proximal second channel $175_1$ whereupon the diverted coolant can flow into one or more of the first channels $145_1$ or $145_{5-8}$.

In the case of the fouling event 202 that affects first channels $145_{6-8}$ at an axial location corresponding to the distal rib $170_5$, coolant that enters and flows through the first channels $145_{6-8}$ eventually impinges upon the fouling event 202. The coolant then and flows upwardly into the intermediate second channel $175_5$ whereupon the diverted coolant can flow into one or more of the first channels $145_{1-5}$.

Figure 4:
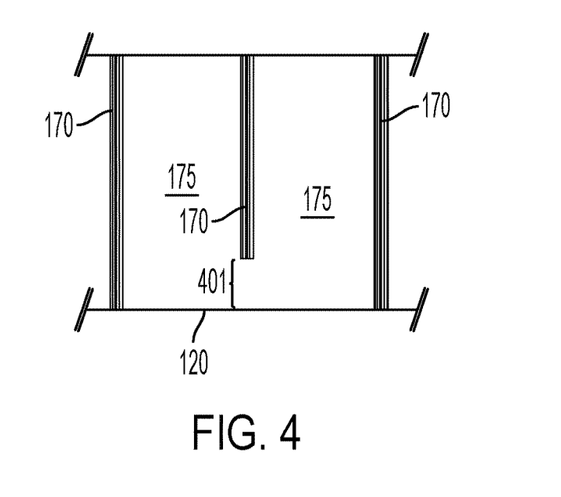
FIG. 4 is a top-down view of a portion of the components illustrated in FIG. 3 in accordance with further embodiments of the present invention.

With reference to FIG. 4, one or more pairs of the second channels 175 can be directly fluidly communicative with one another. In such cases, the intervening rib 170 does not extend across an entirety of a span of the cold plate 120 and thus defines an opening 401 between the pair of the directly fluidly communicative second channels 175.

Figure 5:
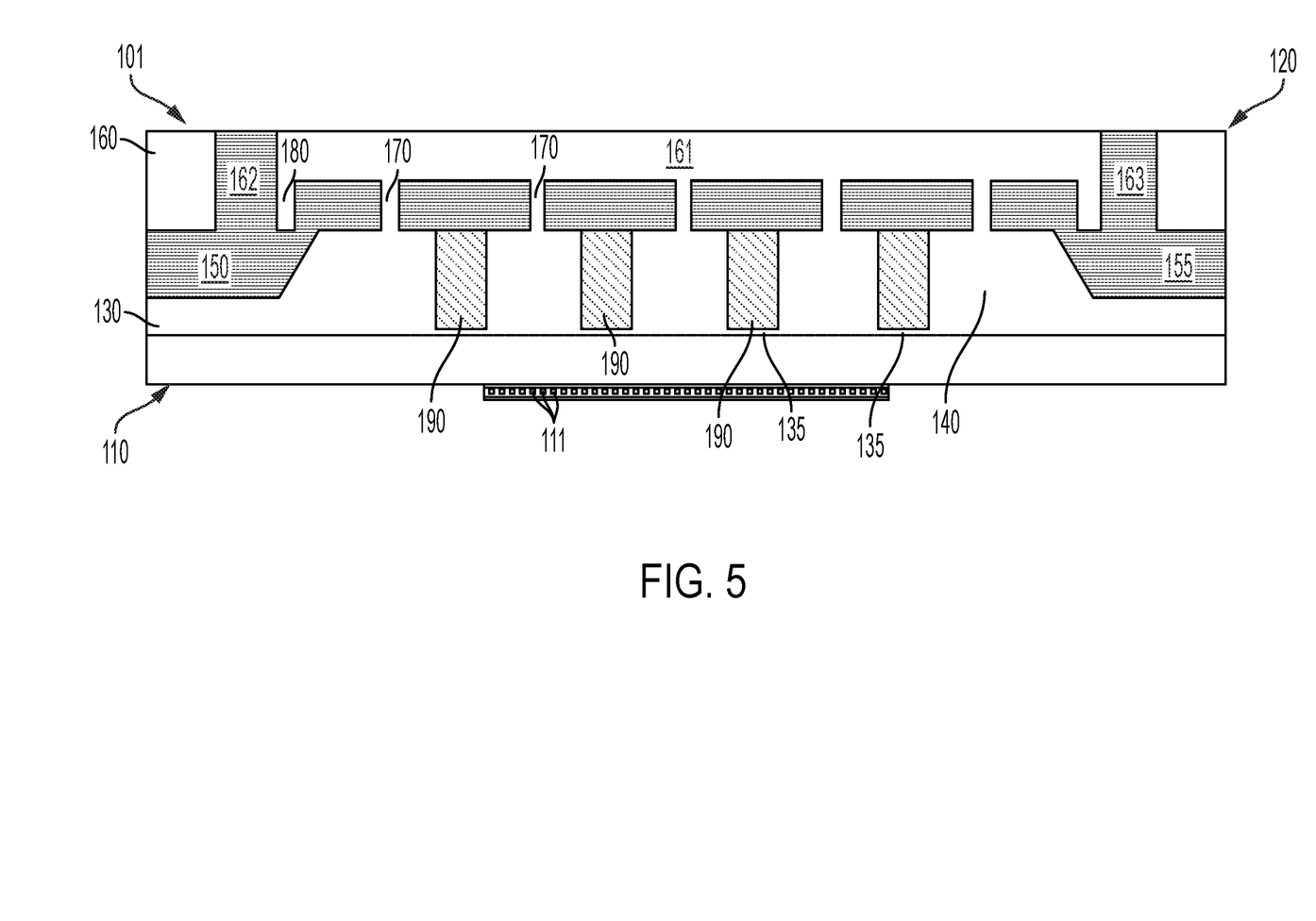
FIG. 5 is a side view of a cold plate assembly in accordance with further embodiments of the present invention.

With reference to FIG. 5 and in accordance with further embodiments of the present invention, the base 130 and the fins 140 of the cold plate 120 can be formed to define third channels 190. These third channels 190 extend transversely relative to the first channels 145 in respective correspondence with the second channels 175 and thus permit direct fluid communication between the second channels 175 and the third channels 190 as well as nearly direct thermal communication between the component 110 and the coolant (i.e., via a thin layer 135 of the base 130).

It is to be understood that while FIGS. 1-5 and the accompanying text in the description provided above illustrate and refers to nine fins $140_{1-9}$, eight first channels $145_{1-8}$, five ribs $170_{1-5}$ and six second channels $175_{1-6}$, this numbering regime is not required and that additional or fewer numbers of each component can be provided in the cold plate 120.

In accordance with further embodiments, flow control features can be disposed or deployed throughout the cold plate 120. Such flow control features can include flow or pressure sensors, valves, pumps and any other suitable devices that can be employed to direct flows of the coolant into different areas of the cold plate 120. For example, the flow or pressure sensors can be deployed in the first, second and third channels 145, 175 and 190 to monitor flows of the coolant through the cold plate 120. As another example, a check valve can be disposed between the blocking element 180 and the fins 140 to prevent backflow of coolant from the proximal second channel $175_1$. As yet another example, pumps can be deployed throughout one or more of the second channels 175 in order to force coolant flow back into the first channels 145 once the coolant has been appropriately bypassed around a fouling event.

In accordance with still further embodiments, operations of the cold plate 120 and the above-noted flow control features can be controlled by a control element disposed in signal communication with the flow control features. Such a control element can include a processing unit, a memory, a networking unit by which the processing unit is receptive of information from flow or pressure sensors in the first, second or third channels 145, 175 or 190, a servo control unit by which the processing unit can control the valves and the pumps and a bus by which the processing unit is communicative with the memory, the networking unit and the servo control unit. The memory can have executable instructions stored thereon, which are readable and executable by the processing unit. These executable instructions are defined such that, when the executable instructions are read and executed by the processing unit, the executable instructions cause the processing unit to control various operations of the cold plate 120 generally and the flow control features in particular.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A cold plate, comprising:
   a base having an upper surface;
   fins extending upwardly from the upper surface to define first channels, each fin comprises an angled surface at an upstream end thereof;
   a plenum, which is partially delimited at its lowermost portion by the upper surface, and which is adjacent to the upstream end of each of the first channels;
   a lid disposable over and above the base and defining an inlet fluidly communicative with the plenum;
   ribs extending downwardly from a lower surface of the lid to the fins, the ribs being arranged to define second channels oriented transversely relative to the first channels, the second channels comprising a proximal second channel fluidly communicative with the plenum; and
   a blocking element that extends downwardly from the lower surface of the lid to terminate at a distance from the angled surface of each of the fins such that the blocking element is configured to encourage coolant flowing through the inlet to flow toward the plenum and the upstream end of each of the first channels and to discourage the coolant from flowing into the proximal second channel.

2. The cold plate according to claim 1, wherein:
   the second channels comprise the proximal second channel, a distal second channel and intermediate second channels between the proximal and distal second channels,
   the proximal second channel allows for fluid communication among the first channels upstream from a proximal rib,
   the distal second channel allows for fluid communication among the first channels downstream from a distal rib, and
   the intermediate second channels respectively allow for fluid communication among the first channels between the corresponding pairs of ribs.

3. The cold plate according to claim 1, wherein one or more pairs of the second channels are directly fluidly communicative with one another.

4. The cold plate according to claim 1, wherein one or more of the ribs is localized at a hot spot of a component.

5. The cold plate according to claim 1, wherein the blocking element is configured to:
   encourage the coolant to flow toward the plenum and the upstream end of each of the first channels and to discourage the coolant from flowing into the proximal second channel when the upstream end of one or more of the first channels is not fouled, and
   discourage the coolant to flow toward the plenum and the upstream end of each of the first channels and to encourage the coolant from flowing into the proximal second channel when the upstream end of one or more of the first channels is fouled.

6. The cold plate according to claim 1, wherein the fins define third channels extending transversely relative to the first channels.

7. A cold plate, comprising:
   a base disposable in contact with a component to be cooled and having an upper surface;
   fins extending upwardly from the upper surface of the base to define first channels, each fin comprises an angled surface at an upstream end thereof;
   a plenum, which is partially delimited at its lowermost portion by the upper surface, and which is adjacent to the upstream end of each of the first channels;
   a lid disposable over and above the base and defining an inlet fluidly communicative with the plenum;
   ribs extending downwardly from a lower surface of the lid to the fins, the ribs being arranged to define second channels oriented transversely relative to the first channels, the second channels comprising a proximal second channel fluidly communicative with the plenum; and
   a blocking element that extends downwardly from the lower surface of the lid to terminate at a distance from the angled surface of each of the fins such that the blocking element is configured to encourage coolant flowing through the inlet to flow toward the plenum and the upstream end of each of the first channels and to discourage the coolant from flowing into the proximal second channel.

8. The cold plate according to claim 7 wherein:
   the second channels comprise the proximal second channel, a distal second channel and intermediate second channels between the proximal and distal second channels, the proximal second channel allows for fluid communication among the first channels upstream from a proximal rib,
   the distal second channel allows for fluid communication among the first channels downstream from a distal rib, and
   the intermediate second channels respectively allow for fluid communication among the first channels between the corresponding pairs of ribs.

9. The cold plate according to claim 7, wherein one or more pairs of the second channels are directly fluidly communicative with one another.

10. The cold plate according to claim 7, wherein one or more of the ribs is localized at a hot spot of the component to be cooled.

11. The cold plate according to claim 7, wherein the blocking element is configured to:
    encourage the coolant to flow toward the plenum and the upstream end of each of the first channels and to discourage the coolant from flowing into the proximal second channel when the upstream end of one or more of the first channels is not fouled, and
    discourage the coolant to flow toward the plenum and the upstream end of each of the first channels and to encourage the coolant from flowing into the proximal second channel when the upstream end of one or more of the first channels is fouled.

12. The cold plate according to claim 7, wherein the base and the fins define third channels extending transversely relative to the first channels.

13. A cold plate assembly, comprising:
    a component comprising electrical devices; and
    a cold plate configured to remove heat generated by the electrical devices, the cold plate comprising:
    a base disposable in contact with a component to be cooled and having an upper surface;
    fins extending upwardly from the upper surface of the base to define first channels, each fin comprises an angled surface at an upstream end thereof;
    a plenum, which is partially delimited at its lowermost portion by the upper surface, and which is adjacent to the upstream end of each of the first channels;
    a lid disposable over and above the base and defining an inlet fluidly communicative with the plenum;

ribs extending downwardly from a lower surface of the lid to the fins, the ribs being arranged to define second channels oriented transversely relative to the first channels, the second channels comprising a proximal second channel fluidly communicative with the plenum; and a blocking element that extends downwardly from the lower surface of the lid to terminate at a distance from the angled surface of each of the fins such that the blocking element is configured to encourage coolant flowing through the inlet to flow toward the plenum and the upstream end of each of the first channels and to discourage the coolant from flowing into the proximal second channel.

14. The cold plate assembly according to claim 13, wherein:

the second channels comprise the proximal second channel, a distal second channel and intermediate second channels between the proximal and distal second channels, the proximal second channel allows for fluid communication among the first channels upstream from a proximal rib, the distal second channel allows for fluid communication among the first channels downstream from a distal rib, and the intermediate second channels respectively allow for fluid communication among the first channels between the corresponding pairs of ribs.

15. The cold plate assembly according to claim 13, wherein one or more of the ribs is localized at a hot spot of the component.

16. The cold plate assembly according to claim 13, wherein the blocking element is configured to:

encourage the coolant to flow toward the plenum and the upstream end of each of the first channels and to discourage the coolant from flowing into the proximal second channel when the upstream end of one or more of the first channels is not fouled, and discourage the coolant to flow toward the plenum and the upstream end of each of the first channels and to encourage the coolant from flowing into the proximal second channel when the upstream end of one or more of the first channels is fouled.

17. The cold plate assembly according to claim 13, wherein the base and the fins define third channels extending transversely relative to the first channels.

* * * * *